United States Patent
Santangelo et al.

(10) Patent No.: US 8,592,944 B2
(45) Date of Patent: Nov. 26, 2013

(54) SEMICONDUCTOR ELECTRONIC DEVICE WITH AN INTEGRATED DEVICE WITH AN INTEGRATED GALVANIC ISOLATOR ELEMENT AND RELATED ASSEMBLY PROCESS

(75) Inventors: Antonello Santangelo, Belpasso (IT); SantoAlessandro Smerzi, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 56 days.

(21) Appl. No.: 13/338,733

(22) Filed: Dec. 28, 2011

(65) Prior Publication Data
US 2012/0168901 A1 Jul. 5, 2012

(30) Foreign Application Priority Data
Dec. 29, 2010 (IT) ............... TO2010A1080

(51) Int. Cl.
*H01L 23/495* (2006.01)
(52) U.S. Cl.
USPC ............. 257/531; 257/528; 257/E23.031
(58) Field of Classification Search
USPC ............. 257/528–543, E23.031
See application file for complete search history.

(56) References Cited

U.S. PATENT DOCUMENTS

| 6,124,756 | A | 9/2000 | Yaklin et al. | |
| 7,064,442 | B1 | 6/2006 | Lane et al. | |
| 7,745,918 | B1 | 6/2010 | Woodyard | |
| 2003/0042571 | A1 | 3/2003 | Chen et al. | |
| 2008/0179963 | A1 | 7/2008 | Fouquet et al. | |
| 2008/0311862 | A1 | 12/2008 | Spina et al. | |
| 2009/0140399 | A1* | 6/2009 | Schulz et al. | 257/660 |
| 2010/0264515 | A1 | 10/2010 | Nakashiba | |
| 2010/0265024 | A1 | 10/2010 | Nakashiba | |
| 2011/0057291 | A1* | 3/2011 | Slupsky et al. | 257/531 |
| 2011/0095392 | A1* | 4/2011 | Wahl et al. | 257/503 |

* cited by examiner

Primary Examiner — Thanh Nguyen
(74) *Attorney, Agent, or Firm* — Seed IP Law Group PLLC

(57) ABSTRACT

An electronic device is provided with: a first electronic circuit, integrated in a first die; a second electronic circuit, integrated in a second die; and a galvanic isolator element, designed to insulate galvanically, and to enable transfer of signals between, the first electronic circuit and the second electronic circuit. The galvanic isolator element has: a transformer substrate, distinct from the first die and from the second die; and a galvanic-insulation transformer formed by a first inductive element, integrated in the first die, and by a second inductive element, integrated in the transformer substrate and so arranged as to be magnetically coupled to the first inductive element.

20 Claims, 3 Drawing Sheets

SEMICONDUCTOR ELECTRONIC DEVICE WITH AN INTEGRATED DEVICE WITH AN INTEGRATED GALVANIC ISOLATOR ELEMENT AND RELATED ASSEMBLY PROCESS

BACKGROUND

1. Technical Field

The present disclosure relates to a semiconductor electronic device provided with an integrated galvanic isolator element, in particular for the insulated transfer of data and/or power signals between two electronic integrated circuits, and to a related assembly process.

2. Description of the Related Art

As is known, many electronic applications transfer signals, which convey some sort of information, or electric power or energy, between two distinct electrical/electronic circuits, without any electrical connection by metal conductors between the same circuits (i.e., without a passage of electrical current occurring through an ohmic connection path). In other words, such applications include two distinct electronic circuits that communicate without contact, being "galvanically" insulated from one another.

For example, a galvanic insulation is commonly used in medical apparatuses (for example, for protecting users from electrical discharge), in applications for industrial automation (for example, for separating the parts operating at high voltage/power from the control parts, or for preventing destructive "ground loops" in the case of interconnections with different ground potentials), or in automotive applications (for example, in the production of electric engines for hybrid vehicles), or in consumer electronics (for example in the production of insulated AC/DC or DC/DC converters).

One of the two electronic circuits, and in particular the corresponding conductive portions at the reference potential, can be at a potential even markedly different from the corresponding portions of the second electronic circuit. This potential difference may also be variable, thus preventing the possibility of using a single common conductor with respect to which the signals are referenced. Finally, there are applications that guarantee an insulation between two electronic circuits (even for voltages of up to some kilovolts), which cannot be achieved with "level shifter" type solutions, in so far as a complete insulation would not be achieved and providing semiconductor components with operating voltages that are so high would become difficult and costly.

Numerous solutions have been proposed for obtaining galvanic isolators in integrated technology (i.e., by using the manufacturing techniques of the semiconductor industry or, in general, of microelectronics). Generally, integrated galvanic isolators are currently divided into three main classes, according to the operating principle adopted.

A first class includes optical couplers, which envisage transmission of signals by using light radiation through a medium transparent thereto, and in particular using a LED-phototransistor pair for carrying out a double electro-optical conversion, in transmission and reception. The main problems linked to this class of isolators are due to the low efficiency of the manufacturing process and to the limited data transfer rate (the so-called "bit rate") that can be achieved, given by the signal conversion, mentioned above, from the optical domain to the electrical domain, and vice versa. In addition, it is known that generally the performance of optical couplers are bound to undergo degradation over time.

Belonging to a second class are capacitive-coupling isolators, in which the galvanic insulation is guaranteed by the presence of an appropriate dielectric set between two conductors (which provide the plates of a capacitor). Capacitive-coupling isolators, albeit enabling high transfer rates to be achieved, are limited by a reduced immunity to voltage transients (the so-called dV/dt), which occur for example when the difference of potential between the two electronic circuits to be insulated varies suddenly; these transients cause generation of high currents that are potentially destructive. Furthermore, this type of isolators does not enable transfer of the d.c. content of the signals, and in particular does not enable transfer of electric power.

The third class includes isolators, envisaging the use of variable magnetic fields for the transfer of signals, and in particular use of a coupling of an inductive, or magnetic, type.

Belonging in this class are, for example, isolators based upon the giant-magnetoresistive (GMR) effect. In these isolators, a first circuit implements a coil driven by a generator, the current of which represents the signal to be transferred (for example, by appropriate modulations), for generating a variable magnetic field. The magnetic field modulates the resistance of magnetoresistive sensors in a second circuit, which is to be insulated with respect to the first. The resistance variation of the magnetoresistive sensors, appropriately arranged in a bridge circuit configuration, produces a voltage that reproduces the transmitted signal. The galvanic insulation is ensured by the insulating material that physically separates the two circuits.

Other isolators, based upon inductive coupling, use a transformer for carrying out insulated transmission of signals between a first electronic circuit and a second electronic circuit. In general, these isolators envisage the use of two coils of conductive material, for example metal, set in the proximity of one another and separated by an appropriate dielectric medium; the coils provide the primary and secondary windings of a transformer, for the insulated transfer of data and/or power signals.

Advantageously, given that it is an intrinsically symmetrical system, a transformer can be operated in reverse to transfer information from the secondary winding to the primary winding, thus enabling provision of a bi-directional system. Furthermore, galvanic isolators based upon inductive coupling enable high transfer rates to be obtained, maintaining a high insensitivity to common-mode transients.

Various solutions have so far been proposed for integrated implementation of transformers for galvanic insulation.

For example, U.S. Pat. No. 7,064,442 and US 2008/0179963 disclose respective electronic devices, comprising in general, and as illustrated schematically in FIG. 1: a first electronic integrated circuit (IC) 2 and a second electronic integrated circuit (IC) 3 (operating, respectively, as "transmitter" and "receiver" of the signals to be transferred), integrating respective electronic components, provided respectively in a first die 4 and in a second die 5 of semiconductor material; and moreover a transformer 6, entirely integrated in a third die 7, which is also made of semiconductor material, for example silicon and set between the dice 4, 5 of the first and second electronic integrated circuits 2, 3, so as to provide the galvanic insulation required between the circuits. The first, second, and third dice 4, 5, 7 are assembled within one and the same package, designated as a whole by 8, and appropriate electrical-connection structures 9 are provided, for example with wire-bonding techniques (i.e., with the use of connection wires), between a primary winding 6a of the transformer 6 and the first electronic integrated circuit 2, and between a secondary winding 6b of the same transformer 6 and the second electronic integrated circuit 3.

The transformer 6 can be formed in the corresponding third die 7, with a "vertical" process, that is, the primary 6a and secondary 6b windings are separated vertically by an appropriate dielectric layer; or with a "horizontal" process, that is, the conductive portions defining both the primary winding 6a and the secondary winding 6b are provided a same surface of a dielectric layer. The latter solution can be, however, disadvantageous in so far as the insulation between the primary winding and the secondary winding of the transformer must be in this case guaranteed not only through the thickness of the dielectric layer, but also on the surface of the same dielectric layer.

In general, the aforesaid solution for providing the galvanic-insulation transformer has some drawbacks linked to the need of envisaging complex electrical-connection structures 9 for the electrical connection of the various distinct parts of which the corresponding electronic devices are made up, and moreover linked to the occupation of area within the package.

A further solution of a known type for providing a transformer as galvanic isolator envisages the use of just two dice of semiconductor material, as schematically illustrated in FIG. 2.

In particular, in a first die, once again designated by 4, the first electronic integrated circuit 2 is provided, for example operating as a transmitter of the signals to be transferred. Instead, both the second electronic integrated circuit 3, having functions of receiver, and the transformer 6, designed to provide the galvanic insulation between the first electronic integrated circuit 2 and the second electronic integrated circuit 3, are provided in a second die 5, set so as to be physically distinct and insulated from the first, but for appropriate electrical connections (for example, provided with the wire-bonding technique). The first and second dice 4, 5 are conveniently assembled within a single package.

In greater detail, the second electronic integrated circuit 3 (shown schematically in FIG. 2 as comprising a plurality of doped regions 3a) is provided with standard processing techniques (for example of a CMOS type, referred to as "baseline CMOS processing", or of a DMOS type) in a structural layer 10 of the second die 5. A passivation layer 11, of dielectric material, is formed on the structural layer 10; within this passivation layer, various metal levels are provided, of which FIG. 2 shows by way of example only a bottom metal level 12 (set in the proximity of the structural layer 10), and a top metal level 13 (set at a distance from the same structural layer 10).

The metal levels, appropriately connected vertically to one another, provide electrical connections towards the second electronic integrated circuit 3. Furthermore, portions of the top metal level 13, appropriately shaped like a coil, provide the secondary winding 6b of the transformer 6.

An insulating layer 14, made of dielectric material, for example polyamide, having a given thickness, is provided on the top metal level 13 and the passivation layer 11; the primary winding 6a of the transformer 6 is provided on the outer surface of the insulating layer 14 (not in contact with the underlying layers), set vertically in a position corresponding to the secondary winding 6b, for example formed with techniques of deposition of a conductive layer (such as, for example, gold). The primary winding 6a is electrically connected to the first electronic integrated circuit 2 in the first die 4, by means of electrical-connection structures 9, for example including connection wires.

The aforesaid insulating layer 14 is deposited on the passivation layer 11, for example by deposition from liquid precursor. In addition, the insulating layer 14 is appropriately removed at the electrical contacts towards the second electronic integrated circuit 3 so as to enable electrical connection thereof towards the outside world by means of appropriate connection elements 15 (for example, once again with the wire-bonding technique).

Although presenting some specific advantages, for example in terms of a reduction of the overall dimensions and of the complexity of the electrical connections, this solution is not free from disadvantages either, some of which afflict in general the known embodiments proposed so far.

In particular, manufacturing of the transformer 6 requires appropriate post-processing steps, which are carried out on top of the structural layer 10 in which, in this case, the second electronic integrated circuit 3 has already been formed. This post-processing may consequently damage the underlying integrated circuit, for example on account of the thermal cycles associated thereto, and in general entails an increase in the complexity and manufacturing costs of the resulting electronic devices.

Furthermore, the characteristics of galvanic insulation of the transformer 6 are linked in this case to the intrinsic and geometrical characteristics of the insulating layer 14, physically set between the primary and secondary windings 6a, 6b of the transformer 6.

However, the post-processing techniques enable thicknesses of insulating material to be achieved that are not greater than a given threshold (for example, having a typical value not greater than 20 μm), thus representing a very precise limit for the maximum insulation voltage that can be achieved.

A further solution for providing a galvanic insulation between two integrated circuits of an electronic device, proposed by the present applicant and described, for example, in EP-A-1 990 914, envisages use of appropriate modulation/demodulation techniques for transmitting a radio-frequency signal from a first micro-antenna set on a first integrated circuit to a second micro-antenna positioned on a second integrated circuit. The two integrated circuits, and the respective micro-antennas, are provided in respective dice of semiconductor material, which can be arranged on one another within one and the same package in such a way as to enable communication between the micro-antennas.

This solution enables high transfer rates to be achieved, with reduced costs and manufacturing complexity; however, the transferred signals may at times be weak on account of the losses induced by the substrates of the aforesaid dice that are set between the micro-antennas. Furthermore, the modulation/demodulation techniques require the use of dedicated transmitter/receiver circuits, entailing an increase of the circuit complexity.

Another galvanic isolation arrangement is shown in US 2010/0265024 to Nakashiba. In Nakashiba, an interconnect substrate, on which a second inductor of a transformer is made, is attached on both of first and second dice by solder balls (having a diameter of around 20 μm). This arrangement involves technical difficulties and limitations that make it unsuitable for production on an industrial level.

First, the distance laterally separating the two dice determines the electrical insulation between the two dice, and therefore is a parameter that must be controlled closely. A first limitation is that this distance cannot be high (contrary to what would be desired for the electrical insulation), to avoid unnecessary increasing the lateral size of the interconnect substrate (and all connections carried by the same substrate). Therefore, placing the interconnect substrate on the two dice requires simultaneous accurate control of all these parameters:

distance between the dice;

alignment between the electrical contacts between the interconnect substrate and the first die; and alignment between the electrical contacts between the interconnect substrate and the second die.

Since alignment of dice is independent of the subsequent placement of interconnect substrate, a maximum tolerance of 14 μm is allowed during manufacturing (considering a diameter of 20 μm for the solder balls). This level of precision is extremely difficult at the industrial level.

Moreover, when the first and second dice are placed on respective lead frames, the distance between the frames will be similar to the distance between the dice, with possible problems of electrical insulation between the frames.

In Nakashiba, also the vertical alignment between the two dice (in particular between the respective front surfaces) is also a source of problems, since it may lead to inclination of the interconnect substrate due to the different thicknesses of the first and second dice (the thickness of a die cannot be typically controlled with repeatability and precision lower than 10 μm), and also to the different thickness of the die attach materials.

A further point to consider is how the insulation between the inductors in the transformer is achieved in Nakashiba. In Nakashiba, the interconnect substrate is simply, as the name suggests, a connecting structure and does not influence the galvanic insulation properties. In Nakashiba, insulation is provided by the separation distance between the dice and by the thickness of the dielectric stack in the first die. Because of this, the first inductor in the first die has to be made in the lower metal layers, and this is per se not advantageous, since these metal layers are those with highest resistivity and low current density. Accordingly, this implies further difficulties in having transformers with high Q and efficiency.

BRIEF SUMMARY

One embodiment of the present disclosure is an integrated galvanic isolator that solves, at least in part, the problems of the known structures, and in particular will not require, for its production, steps of post-processing of the electronic integrated circuits for which it provides the galvanic insulation.

According to the present disclosure, an electronic device, provided with an integrated galvanic isolator element, and a corresponding assembly process, are provided as defined in the annexed claims.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

As will be described in detail in what follows, a peculiar aspect of the present disclosure envisages solution of the problem of galvanic insulation between two electronic integrated circuits, each provided in a respective die of semiconductor material, guaranteeing both the transfer of information or data and the transport of power or energy, by using a transformer (or, in general, an inductive or electromagnetic coupling element), which is only in part provided in a first die integrated in which is a first one of the two electronic circuits, and for the remaining part is provided on an appropriate substrate, distinct and separate from both of the dice in which the electronic circuits are integrated. This substrate is appropriately arranged above the aforesaid first die, and the associated electronic integrated circuit, in such a way as to provide the transformer, which guarantees the inductive, or electromagnetic, coupling between corresponding primary and secondary windings, and moreover the galvanic insulation between the two electronic integrated circuits.

In general, one of the windings of the transformer is provided, using known microelectronic manufacturing techniques, on the same die as that in which one of the two electronic integrated circuits that are to communicate with one another and are to be galvanically insulated from one another is provided (for example, being obtained using the last metal level normally provided in CMOS or DMOS technology), whereas the other winding is separately made on a specific substrate, which can hence be optimized for galvanic insulation and which is only subsequently coupled to the aforesaid electronic integrated circuit, without hence requiring additional post-processing steps that could for example degrade the performance thereof.

Figure 1:
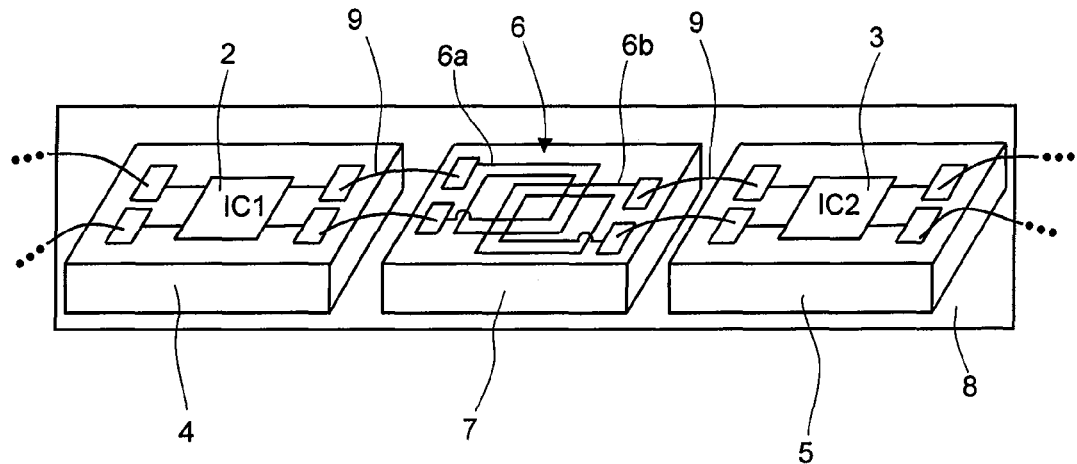
FIGS. 1 and 2 are schematic illustrations of known embodiments of integrated galvanic isolators.
Figure 2:
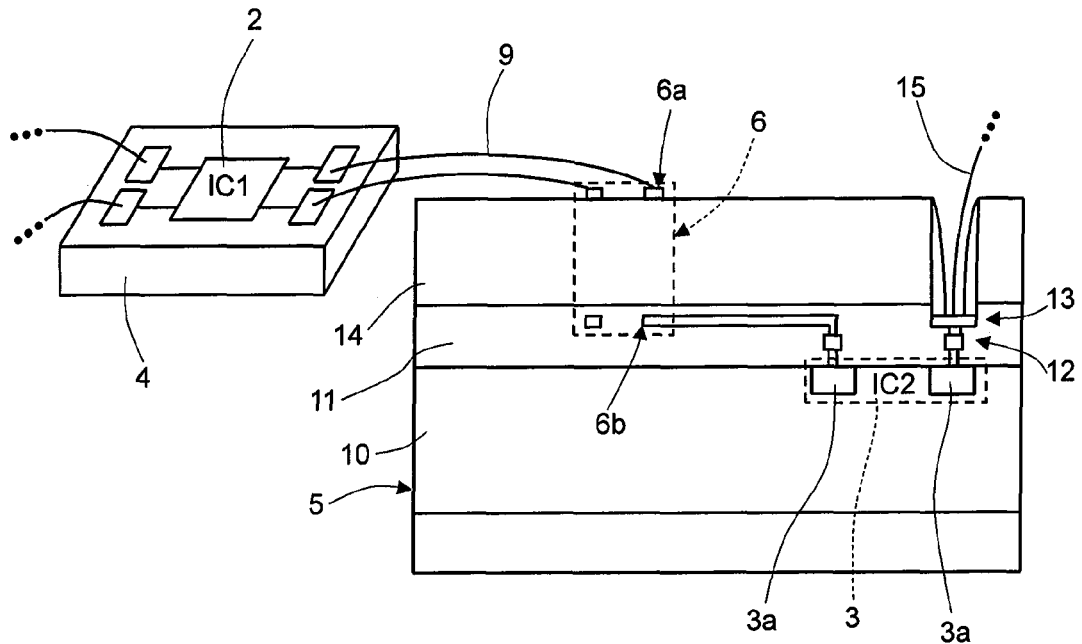
Figure 3:
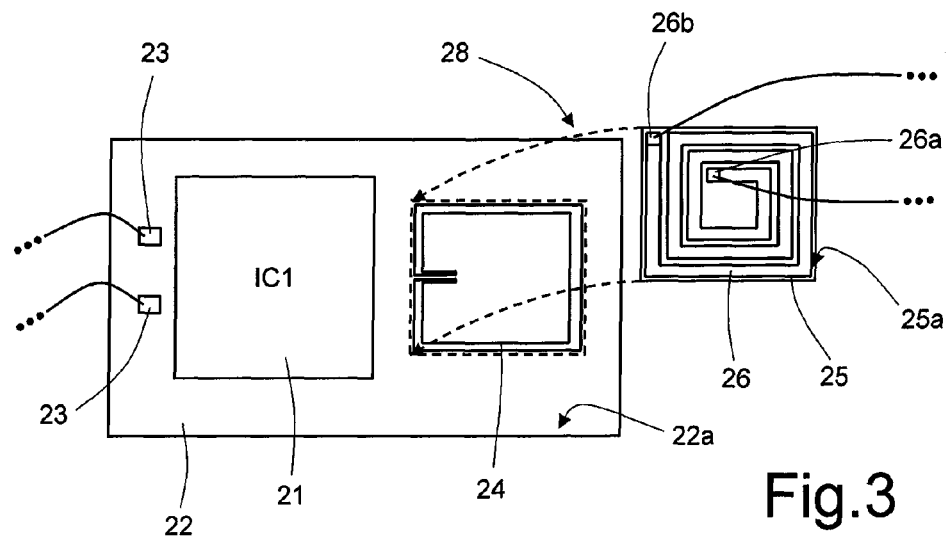
FIGS. 3 and 4 are schematic top plan views of a galvanic isolator element and of an electronic device incorporating the galvanic isolator element, according to an embodiment of the present disclosure.
Figure 4:
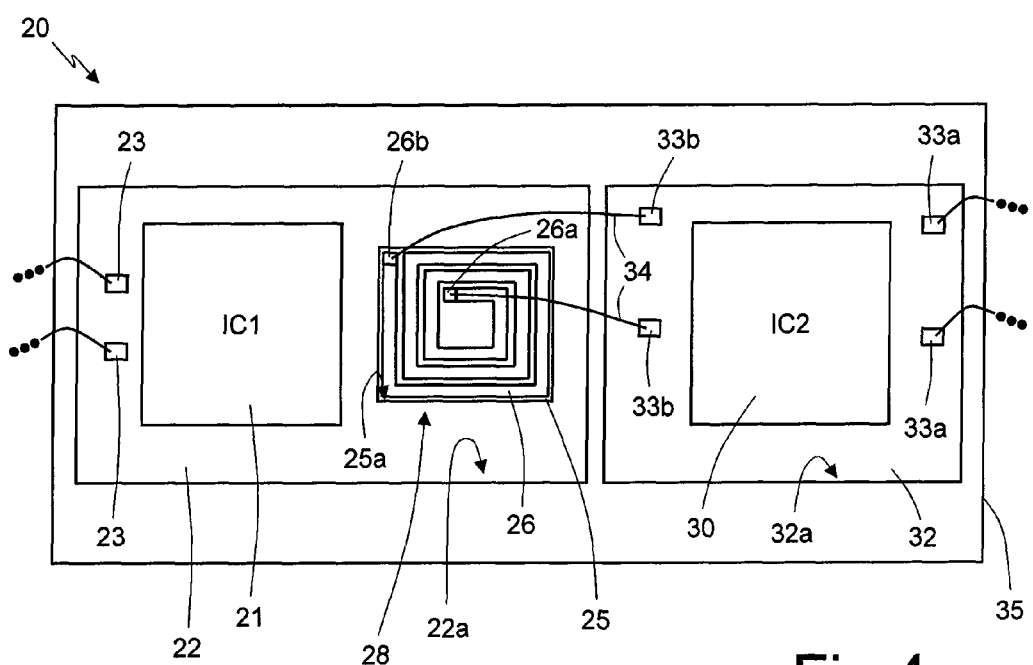

In greater detail, and with reference to FIGS. 3 and 4, an electronic device, designated by 20, comprises a first electronic integrated circuit 21, for example a circuit for transmitting appropriate data or power signals, integrated in a first die 22 of semiconductor material, for example silicon. The first electronic integrated circuit 21 is provided in the first die 22 with standard manufacturing techniques of the semiconductor industry, for example with CMOS or DMOS technology.

The first die 22 moreover carries first contact pads 23, of an appropriate conductive material, accessible at a top surface 22a thereof and made in a known way, designed to enable electrical connection, for example with the wire-bonding technique, of the first electronic integrated circuit 21 from outside the electronic device 20.

Furthermore, a first inductor (or coil) 24, constituted by an inductive element, for example by a turn of conductive material, in the example illustrated shaped in a generically square loop, is provided at the top surface 22a of the first die 22. In particular, the first inductor 24 is provided, as will be described in detail hereinafter, in a top metal level of the structure of the first die 22, as generally envisaged in CMOS or DMOS technology, so as to be electrically connected to one or more regions of the first electronic integrated circuit 21.

The electronic device 20 further comprises a transformer substrate 25, made of insulating material with low loss and high dielectric strength, such as for example: a plastic material; a polymer; polyester; polyethylene; polyamide (KAPTON™); Pyralux™; a glass fiber; a resin; an epoxy resin; ceramic; or glass.

A second inductor (or coil) 26, constituted by a respective inductive element, made of conductive material, for example shaped as a square spiral, is provided at a top surface 25a of the transformer substrate 25; the second inductor 26 has a first terminal 26a and a second terminal 26b. Various known techniques may be used to provide the second inductor 26 on the insulating material of which the transformer substrate 25 is made, according, amongst other things, to the type of the insulating material.

For example, in the case where the transformer substrate 25 is made of a polyamide layer, a lamination process, commonly adopted in the production of flexible printed circuits boards (PCBs), may be used to define the conductive material of the inductive element. Using this technique, it is possible, for example, to attach a copper layer of a thickness of various microns on the polyamide layer. Next, the copper layer may be defined by photolithographic and etching processes to form, on the top surface 25a of the transformer substrate 25, an appropriate inductor geometry (for example of the spiral or loop type), and the corresponding terminals 26a, 26b. In a known manner, the definition of the transformer substrate 25 may result from an operation of dicing and separation starting from a single layer or wafer of material, which is appropriately cut into a plurality of dice (after possibly being thinned out, according to the specific desires of thickness and associated galvanic insulation).

In a different exemplary embodiment, the transformer substrate 25 is made of glass; in a known manner, glass substrates are in fact available and commonly used, also in the form of circular wafers, which can undergo processes of machining typical of the semiconductor industry. In this case, it is possible to deposit, and then define, directly on the top surface 25a of the transformer substrate 25, an appropriate metal layer, for example of copper, using techniques that are proper to the microelectronics field.

According to an aspect of the present disclosure, and as illustrated schematically in FIG. 3, during assembly of the electronic device 20, the transformer substrate 25 is set on the top surface 22a of the first die 22, set vertically in a position corresponding to the area occupied by the first inductor 24 (indicated by a dashed box). In this way, the first inductor 24, provided in the first die 22, and the second inductor 26, provided on the transformer substrate 25, are to define together an integrated galvanic isolator element 28, in particular a transformer of which the first inductor 24 constitutes a primary winding and the second inductor 26 constitutes a secondary winding, and in which the insulating material of which the transformer substrate 25 is made contributes to providing a galvanic-insulation barrier.

In particular, the transformer substrate 25 is attached on the top surface 22a of the first die 22 by an appropriate adhesive layer (here not illustrated), for example constituted by an appropriate epoxy or acrylic material, or in general by a material with high dielectric strength, good adhesion and chemical and mechanical compatibility with the material constituting the first die 22 (and moreover with respect to the type of package that is used, as will be discussed hereinafter). Also this adhesive layer contributes to providing the galvanic insulation between the primary and secondary windings of the transformer of the galvanic isolator element 28.

The electronic device 20 further comprises, as illustrated in FIG. 4, a second electronic integrated circuit 30, for example a circuit for receiving appropriate data or power signals transmitted by the first electronic circuit 21, integrated in a second die 32 of semiconductor material, for example silicon. The second electronic integrated circuit 30 is provided in the second die 32 with standard manufacturing techniques of the semiconductor industry, for example with CMOS or DMOS technology.

The second die 32 carries second contact pads 33a, accessible at a top surface 32a thereof and designed to enable electrical connection, for example with the wire-bonding technique, of the second electronic integrated circuit 30 from outside the electronic device 20.

Furthermore, first electrical-connection elements 34, for example electrical wires (with the wire-bonding technique), electrically connect the terminals 26a, 26b of the second inductor 26, accessible from outside the transformer substrate 25, with third contact pads 33b, which are also carried by the top surface 32a of the second die 32 so as to provide the electrical connection between the second electronic circuit 30 and the secondary winding of the galvanic isolator element 28.

According to another embodiment of the present disclosure, the transformer substrate 25 is part of a transformer substrate wafer that is applied on the corresponding die wafer where the various first dice 22 are made (before singulation of the first dice). The transformer substrate wafer is placed on the die wafer after all the steps for forming the first die 22 have been carried out, and then the second inductors 26 are made in positions corresponding to those of the first inductors 24 of the first dice. Openings to the electrical contacts on the first dice 22 are also opened through the transformer substrate wafer. At the end of the process, the wafers are singulated, so as to provide the final dice (each being an assembly of one of the first dice 22 and one of the transformer substrates 25), which will then packaged with the corresponding second die 32.

In another embodiment, transformer substrate and die wafers are again used, but with the difference that the transformer substrate wafer is wholly processed before being placed on the die wafer. That is, the second inductors 26 and openings are made on/in the transformer die wafer, the completely formed transformer die wafer is aligned to the die wafer, and the wafers are singulated into the final dice.

Figure 5:
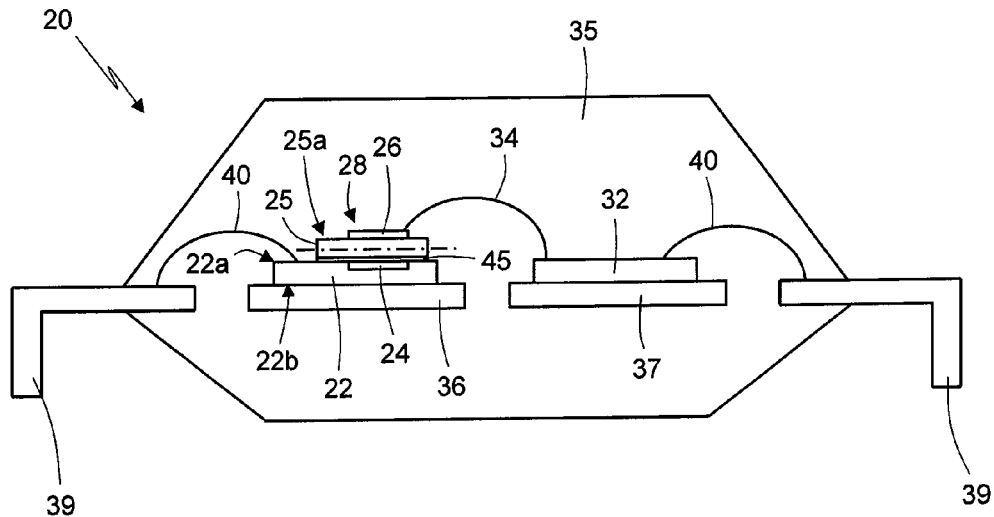
FIG. 5 shows a schematic cross section of the electronic device of FIG. 4, after packaging in a corresponding package.

As illustrated also in FIG. 5, the first die 22, the overlying transformer substrate 25, and the second die 32 are housed within a package 35, made, in a known way, of an appropriate packaging material (usually defined as "molding compound"), surrounding the same dice and constituted, for example, by a plastic material.

In particular, the first die 22 is fixed to a first support, generally known as "leadframe" 36, for example made of metal material, in particular at a bottom surface 22b thereof, vertically opposite to the top surface 22a. Likewise, the second die 32 is fixed to a second support (or leadframe) 37, which is also made, for example, of metal material and is physically distinct and electrically insulated from the first leadframe 36. In a manner known in the field of packaging techniques, the first and second leadframes 36, 37 are set alongside one another in a planar way, at one and the same level with respect to pins 39, which come out of the package 35 to enable the electrical connection with the outside, for example with a printed circuit board (PCB), here not illustrated, to which the package 35 is designed to be coupled, for example via soldering technique.

Within the package 35, second electrical-connection elements 40, for example electrical wires (with the wire-bonding technique), electrically connect the first contact pads 23 (here not illustrated) carried by the first die 22, and the second contact pads 33a (here not illustrated) carried by the second die 32, to respective pins 39 of the package 35.

Figure 6:
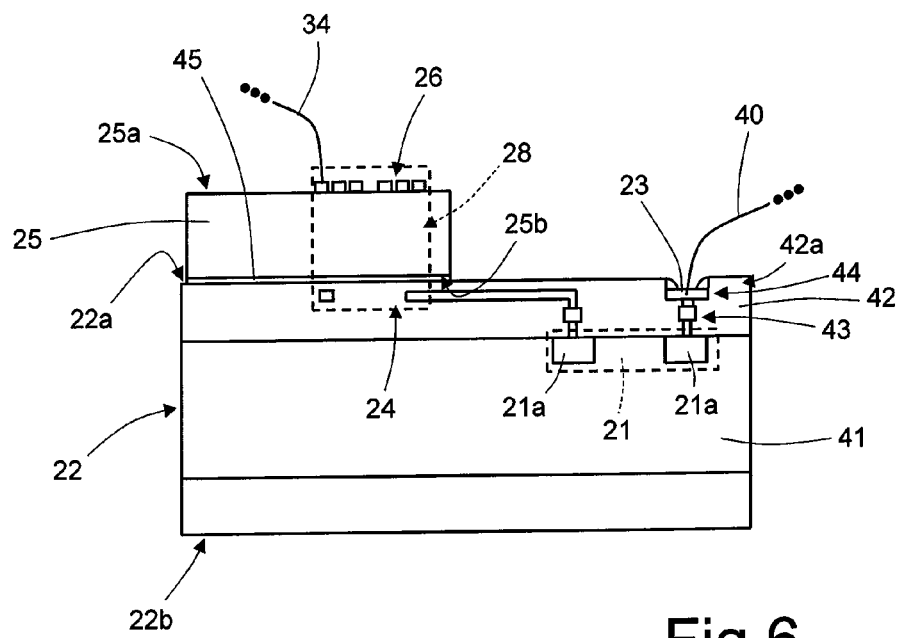
FIG. 6 shows an enlarged and detailed cross section of a galvanic isolator element of the electronic device of FIG. 5.

FIG. 6 shows an example of assembly and construction of the first die 22 and of the transformer substrate 25, in particular regarding formation of the galvanic isolator element 28.

The first integrated circuit 21 (which is shown schematically as comprising a plurality of doped regions 21a) is provided with standard manufacturing techniques (for example, "baseline CMOS processing" techniques) in a structural layer 41 of the first die 22. The structural layer 41, for example made of silicon, has high resistivity in order to minimize the losses of the galvanic isolator element 28.

A passivation layer 42, made of dielectric material (for example, silicon oxide or silicon nitride) is provided on the structural layer 41, and within the passivation layer 42 various metal levels are provided (of which only a bottom metal level 43 and a top metal level 44, the latter conveniently having a greater thickness of metal material, are shown by way of example). A surface portion (set at a distance from the structural layer 41) of the passivation layer 42, designated by 42a, overlies the top metal level 44, and moreover defines the top surface 22a of the first die 22. The passivation layer 42 may be provided as a multilayer, i.e., being constituted by a plurality of superimposed layers, of which the aforesaid surface portion 42a constitutes a top layer.

In particular, first portions of the top metal level 44, accessible from outside the first die 22 through appropriate openings provided through the surface portion 42a of the passivation layer 42, define the first contact pads 23, which are designed to enable the electrical connection of the first electronic integrated circuit 21 towards the outside of the electronic device 20 by means of the second electrical-connection elements 40.

Second portions of the same top metal level 44, appropriately shaped in the form of coil or turn, define, instead, the first inductor 24 of the transformer of the galvanic isolator element 28, whereas third portions of the same top metal level 44, electrically connected to the aforesaid second portions, provide, together with appropriate vertical connection elements (extending through the passivation layer 41 and the various metal levels), the electrical connection between the same first inductor 24 and the first electronic integrated circuit 21.

In order to minimize the losses of the transformer, it is convenient to prevent, in the region of the structural layer 41 neighboring the aforesaid first inductor 24, the provision of any type of supplementary doping (with respect to a possible base doping of the structural layer 41). Furthermore, it is advantageous to form the top metal level 44 with a material having reduced resistivity, such as for example copper, which can moreover be provided having a high thicknesses.

The transformer substrate 25 is attached on the top surface 22a of the first die 22 (and on the surface portion 42a of the passivation layer 42, which may, however, alternatively not be present), vertically in a position corresponding to the region of the same first die 22 in which the first inductor 24 is provided. In particular, a bottom surface 25b of the transformer substrate 25, i.e., the surface opposite to the top surface 25a, is bonded to the top surface 22a of the first die 22 by means of an adhesive layer 45 made of appropriate insulating material (as previously described).

Conveniently, the transverse dimensions (i.e., the dimensions in a horizontal plane transverse to the vertical direction of stacking between the first die 22 and the transformer substrate 25) of the transformer substrate 25, which may for example be of the order of a thousand of $\mu m^2$, are such that at least part of the top surface 22a of the first die 22 remains free (i.e., not covered by the same transformer substrate 25), so that the first contact pads 23 remain free and accessible from the outside; in particular, this allows soldering of the first contact pads 23 to the second electrical-connection elements 40, which are in turn connected, at an opposite end, to respective pins 39 of the package 35.

Alternatively, in the case (not illustrated) where the transverse dimensions of the transformer substrate 25 are such as to be superimposed, even only partially, on the region of the first die 22 in which the first contact pads 23 are provided, appropriate openings are provided through the same transformer substrate 25, enabling access to the first contact pads 23.

In any case, the second inductor 26, for example shaped like a loop, is provided on the top surface 25a of the transformer substrate 25, in a position vertically corresponding to that of the first inductor 24, in such a way as to define, in the vertical direction, the transformer of the galvanic isolator element 28.

In particular, the total thickness of dielectric material set between the first inductor 24 and the second inductor 26, defined by the sum of the thicknesses of the transformer substrate 25, of the adhesive layer 45, and of the possible surface portion 42a of the passivation layer 42, may be chosen and defined at the design stage in such a way as to satisfy the desired degree of insulation (for example, this thickness may range from 25 μm to 150 μm).

Evidently, the higher the insulation voltage desired, the greater the thickness should be and the smaller the inductive/electromagnetic coupling between the two inductive elements (first and second inductors 24, 26). However, the losses will be, in any case, reduced, thanks to the intrinsic electrical properties of the material of the transformer substrate 25 (which may be selected in a specific and appropriate way to satisfy these needs), to the characteristics of the other dielectric layers possibly interposed, and to the high resistivity of the semiconductor material of the first die 22.

In a way not illustrated, in order to protect the conductive layer of which the second inductor 26 is made, an appropriate further passivation layer, also made, for example, of polyamide, may be provided on the top surface 25a of the transformer substrate 25; openings are conveniently made through this further passivation layer, in positions corresponding to the terminals 26a, 26b of the second inductor 26 (to enable thus soldering of the first electrical-connection elements 34 and transfer of the signals from the first electronic integrated circuit 21 to the second electronic integrated circuit 30). The further passivation layer may alternatively be provided by means of deposition of an appropriate dielectric material, such as for example silicon nitride or silicon oxide, starting from a liquid precursor.

The advantages of the electronic device provided with a galvanic isolator and of the corresponding assembly process emerge clearly from the foregoing description.

In particular, it is emphasized again that provision of just one of the two inductive elements of the galvanic-insulation transformer in a substrate distinct from the die in which the electronic integrated circuits that are to be insulated from one another are provided (and between which the transfer of data and/or power signals is to be ensured) enables a greater freedom of design in the selection of the materials, of the dimensions, and in achieving the desired electrical characteristics. Furthermore, assembly of this substrate for obtaining the galvanic-insulation transformer does not entail steps of post-processing of the dice for the electronic circuits, thus preventing possible damages and reducing the complexity and the manufacturing costs. The occupation of space and complexity of the connections are moreover improved.

In addition, in the device 20, positions of the first and second die are independent (each is placed on a respective frame) and the use of wire connections does not entail any problem in their placement. Also, the alignment of the transformer substrate 25 on the first die 22 is not critical, since the inductive coupling is maintained even with offset of several tens of μm.

In particular, it is the thickness of the transformer substrate which mainly determines the galvanic insulation properties of the structure (and may be properly chosen according to this specific issue). It is underlined that the first inductor 24 is made in the first die 22 using the top metallization level, which has low resistivity and high current density, allowing to obtain high quality inductors.

Manufacturing of the inductor in the dedicated substrate may advantageously involve standard techniques of the semiconductor industry, or in general of microelectronic machining.

The solution described is, for example, particularly advantageous for the insulated transfer, via a transformer, of power between two electronic integrated circuits. In particular, the present Applicant has experimentally found that, using a resonant configuration for both the primary winding and the secondary winding of the transformer and a high operating frequency (for example, 350 MHz), it is possible to transfer power with a high efficiency, in particular with a theoretical value even of approximately 80%.

Finally, it is clear that modifications and variations may be made to what has been described and illustrated herein, without thereby departing from the scope of the present disclosure.

In particular, it is clear that the configuration described for the inductors 24, 26 may be used, not only for the definition of the primary and secondary windings of an insulation transformer, but also for providing a transmission micro-antenna and, respectively, a reception micro-antenna, in the case where the galvanic isolator element 28 provides wireless transfer of an electromagnetic type of data or power signals to be transmitted, appropriately modulated (in this case varying the conditions of driving and biasing of the inductive elements, as will be clear to persons skilled in the field).

Furthermore, it is evident that the assembly process may likewise envisage the provision of a plurality of inductive elements in the transformer substrate 25 and in the first die 22, and of corresponding inductive couplings between the same elements. In particular, this solution may be advantageous for obtaining a plurality of simultaneous transmission and reception paths (for example, to obtain a full-duplex data communication). In this case, it is in fact sufficient, before dicing the wafer of material that leads to definition of the transformer substrate 25, to provide on the surface of the same wafer, a desired number of inductors for each substrate, by definition of one and the same conductive layer.

The geometry of the elements constituting the electronic device 20 may also vary with respect to what has been described and illustrated; for example, the inductors 24, 26 may have a different conformation; for instance, the corresponding turns may have a generically circular shape, instead of a square shape.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
a first electronic circuit integrated in a first die;
a second electronic circuit integrated in a second die; and
a galvanic isolator element positioned on, and entirely supported by, the first die, the galvanic isolator element being configured to insulate galvanically, and to enable transfer of signals between, said first and second electronic circuits, wherein said galvanic isolator element comprises:
a transformer substrate distinct from said first die and said second die;
a first inductive element integrated in said first die; and
a second inductive element integrated in said transformer substrate and configured to be operatively coupled to said first inductive element.

2. The device according to claim 1, wherein:
said first die comprises a structural layer of semiconductor material in which said first electronic circuit is integrated;
a dielectric layer is set on said structural layer;
a top metal level is arranged at a top portion of said dielectric layer, at a distance from said structural layer;
said first inductive element is positioned in the top metal layer; and
said transformer substrate is arranged on said first die so that said second inductive element vertically overlies, and is magnetically coupled to, said first inductive element, thereby forming a transformer.

3. The device according to claim 2, wherein:
said transformer substrate is made of a dielectric material;
said second inductive element is set on a top surface of said transformer substrate, opposite to a bottom surface of said transformer substrate, which is coupled to said first die; and
said galvanic insulation is provided at least through a thickness of said transformer substrate.

4. The device according to claim 2, further comprising an adhesive layer, of insulating material, attaching the first die to the transformer substrate; wherein an overall thickness of said adhesive layer and of said transformer substrate, set between said first inductive element and said second inductive element, contributes to galvanically insulating said first and second electronic circuits from each other.

5. The device according to claim 2, wherein the second die is spaced apart laterally with respect to the first die and the transformer substrate, the device further comprising a conductor that electrically couples the second electronic circuit to the second inductive element.

6. The device according to claim 1, wherein said transformer substrate is made of a dielectric material in the group consisting of: a plastic material, a polymer, polyester, polyethylene, polyamide, Pyralux™, a glass fiber, a resin, an epoxy resin, ceramic, and glass.

7. The device according to claim 1, wherein said first inductive element and said second inductive element include a respective coil of conductive material.

8. The device according to claim 1, further comprising:
a package;
a first leadframe on which said first die is positioned;
a second leadframe electrically insulated from the first leadframe and on which said second die is positioned, the first and second dies being set alongside one another within the package; and
first and second electrical-connection elements coupled to the first and second leadframes, respectively, and protruding from said package for electrical connection outside of said electronic device.

9. The device according to claim 1, further comprising:
first connection elements integrated in said first die and electrically coupling said first inductive element to said first electronic circuit; and
second connection elements extending between said transformer substrate and said second die and electrically coupling said second inductive element to said second electronic circuit.

10. The device according to claim 1, wherein:
said first electronic circuit includes a transmitter electrically coupled to said first inductive element and configured to transmit said signals; and
said second electronic circuit includes a receiver electrically coupled to said second inductive element and configured to receive said signals from the transmitter.

11. An electronic device, comprising:
a first electronic circuit integrated in a first semiconductor die;
a second electronic circuit integrated in a second semiconductor die; and
a galvanic isolator element positioned on, and entirely supported by, the first semiconductor die, the galvanic isolator element being configured to insulate galvanically, and to enable transfer of signals between, said first and second electronic circuits, wherein said galvanic isolator element comprises:
a transformer substrate distinct from said first semiconductor die and said second semiconductor die, the transformer substrate being vertically aligned with the first semiconductor die and laterally spaced apart from the second semiconductor die;
a first inductive element integrated in said first semiconductor die; and
a second inductive element integrated in said transformer substrate and configured to be operatively coupled to, and vertically aligned with, said first inductive element.

12. The device according to claim 11, comprising:
a dielectric layer positioned on said first semiconductor die and between the first semiconductor die and the transformer substrate; and
a metal level buried within said dielectric layer and at a distance from said first semiconductor die, wherein:
said first inductive element is part of the metal layer; and
said second inductive element is magnetically coupled to said first inductive element, thereby forming a transformer.

13. The device according to claim 11, further comprising a conductor that electrically couples the second electronic circuit to the second inductive element.

14. The device according to claim 11, wherein:
said transformer substrate is made of a dielectric material;
said transformer substrate includes top and bottom surfaces, the bottom surface facing the first semiconductor die;
said second inductive element is positioned on the top surface of said transformer substrate; and
said galvanic insulation is provided at least through a thickness of said transformer substrate.

15. The device according to claim 11, further comprising an adhesive layer, of insulating material, attaching the first semiconductor die to the transformer substrate; wherein an overall thickness of said adhesive layer and of said transformer substrate, set between said first inductive element and said second inductive element, contributes to galvanically insulating said first and second electronic circuits from each other.

16. The device according to claim 11, further comprising:
a package;
a first leadframe on which said first semiconductor die is positioned;
a second leadframe electrically insulated from the first leadframe and on which said second semiconductor die is positioned, the first and second semiconductor dies being set alongside one another within the package; and
first and second electrical-connection elements coupled to the first and second leadframes, respectively, and protruding from said package for electrical connection outside of said electronic device.

17. The device according to claim 11, wherein:
said first electronic circuit includes a transmitter electrically coupled to said first inductive element and configured to transmit said signals; and
said second electronic circuit includes a receiver electrically coupled to said second inductive element and configured to receive said signals from the transmitter.

18. A packaged electronic device, comprising:
a package;
a first electronic circuit integrated in a first semiconductor die;
a second electronic circuit integrated in a second semiconductor die, the first and second semiconductor dies being positioned within the package; and
a galvanic isolator element positioned on, and entirely supported by, the first semiconductor die, the galvanic isolator element being positioned within the package and configured to insulate galvanically, and to enable transfer of signals between, said first and second electronic circuits, wherein said galvanic isolator element comprises:
a transformer substrate distinct from said first semiconductor die and said second semiconductor die, the transformer substrate being vertically aligned with the first semiconductor die;
a first inductive element integrated in said first semiconductor die; and
a second inductive element integrated in said transformer substrate, the second inductive element being electrically coupled to the second electronic circuit and configured to be operatively coupled to, and vertically aligned with, said first inductive element.

19. The packaged device according to claim 18, comprising:
a dielectric layer positioned on said first semiconductor die and between the first semiconductor die and the transformer substrate; and
a metal level buried within said dielectric layer, at a distance from said first semiconductor die, wherein:
said first inductive element is part of the metal layer; and
said second inductive element is magnetically coupled to said first inductive element, thereby forming a transformer.

20. The packaged device according to claim 18, further comprising:
a first leadframe on which said first semiconductor die is positioned;
a second leadframe electrically insulated from the first leadframe and on which said second semiconductor die is positioned, the first and second semiconductor dies being set alongside one another within the package.

* * * * *